US006864497B2

(12) United States Patent
Orsini et al.

(10) Patent No.: US 6,864,497 B2
(45) Date of Patent: Mar. 8, 2005

(54) DROPLET AND FILAMENT TARGET STABILIZER FOR EUV SOURCE NOZZLES

(75) Inventors: Rocco A. Orsini, Long Beach, CA (US); Michael B. Petach, Redondo Beach, CA (US); Roy D. McGregor, El Camino Village, CA (US)

(73) Assignee: University of Central Florida Research Foundation, Orlando, FL (US)

( * ) Notice: Subject to any disclaimer, the term of this patent is extended or adjusted under 35 U.S.C. 154(b) by 121 days.

(21) Appl. No.: 10/317,402

(22) Filed: Dec. 11, 2002

(65) Prior Publication Data

US 2004/0114720 A1 Jun. 17, 2004

(51) Int. Cl.[7] ............................ G01J 1/00; G21G 4/00; H01J 35/00
(52) U.S. Cl. .................... 250/504 R; 378/119
(58) Field of Search ......................... 250/493.1, 504 R; 315/111.21; 378/119, 143

(56) References Cited

U.S. PATENT DOCUMENTS

| 6,002,744 | A | | 12/1999 | Hertz et al. | |
|---|---|---|---|---|---|
| 6,324,256 | B1 | * | 11/2001 | McGregor et al. | 378/119 |
| 6,657,213 | B2 | * | 12/2003 | Orsini et al. | 250/504 R |
| 6,738,452 | B2 | * | 5/2004 | McGregor et al. | 378/119 |

FOREIGN PATENT DOCUMENTS

WO    WO 02/32197 A1    4/2002

OTHER PUBLICATIONS

Hansson, Bjorn A.M.; Rymell, Lars; Berglund, Magnus; Hemberg, Oscar; Janin, Emmanuelle; Mosesson, Sofia and Thoresen, Jalmar; "A Liquid–Xenon–Jet Laser–Plasma Source for EUV Lithography", 3rd International Workshop on EUV Lithography, 2001, 5 pps.

Wieland, M.; Wilhein, T.; Faubel, M.; Ellert, Ch.; Schmidt, M.; and Sublemontier, O.,"EUV and Fast Ion Emission from Cryogenic Liquid Jet Target Laser–Generated Plasma" Appl. Phys. B 72, 591–597 (2001)/Digital Object Identifier (DOI) 10.1007/s003400100542.

Rymell, L.; Berglund, M; Hansson, B.A.M.; and Hertz, H.M.; "X–Ray and EUV Laser–Plasma Sources Based on Cryogenic Liquid–Jet Target"; Biomedical and X–Ray Physics, Royal Institute of Technology, SE–10044 Stockholm, Sweden; Part of the SPIE Conference on Emerging Lithograph Technologies III, Santa Clara, California, Mar. 1999; pps. 421–423.

Gouge, Michael J. and Fisher, Paul W.; "A Cryogenic Xenon Droplet Generator for Use in a Compact Laser Plasma X–Ray Source"; Feb. 11, 1997; pps. 2158–2162.

Klebniczki, J; Hebling, J.; Hopp, B.; Hajos, G. and Bor, Z.; "Fluid Jet with Variable Thickness in the range 5–20 mu m"; Meas. Sci. Technol. 5 (May 1994) 601–603.

* cited by examiner

Primary Examiner—John R. Lee
Assistant Examiner—Paul M. Gurzo
(74) Attorney, Agent, or Firm—Joan A. Miller; Warn, Hoffmann, Miller & LaLone, P.C.

(57) ABSTRACT

An EUV radiation source that creates a stable solid target filament. The source includes a nozzle assembly having a condenser chamber for cryogenically cooling a gaseous target material into a liquid state. The liquid target material is forced through an orifice of a target filament generator into an evaporation chamber as a liquid target stream. The evaporation chamber has a higher pressure than a vacuum process chamber of the source to allow the liquid target material to freeze into a target filament in a stable manner. The frozen target filament is emitted from the evaporation chamber into the process chamber as a stable target filament towards a target area. The higher pressure in the evaporation chamber can be the result of the evaporative cooling of the target material alone or in combination with a supplemental gas.

26 Claims, 2 Drawing Sheets

DROPLET AND FILAMENT TARGET STABILIZER FOR EUV SOURCE NOZZLES

BACKGROUND OF THE INVENTION

1. Field of the Invention

This invention relates generally to a laser-plasma extreme ultraviolet (EUV) radiation source and, more particularly, to a laser-plasma EUV radiation source that provides a stable solid target filament by employing an evaporation chamber to increase the vapor pressure around the liquid target material as it exits the nozzle.

2. Discussion of the Related Art

Microelectronic integrated circuits are typically patterned on a substrate by a photolithography process, well known to those skilled in the art, where the circuit elements are defined by a light beam propagating through a mask. As the state of the art of the photolithography process and integrated circuit architecture becomes more developed, the circuit elements become smaller and more closely spaced together. As the circuit elements become smaller, it is necessary to employ photolithography light sources that generate light beams having shorter wavelengths and higher frequencies. In other words, the resolution of the photolithography process increases as the wavelength of the light source decreases to allow smaller integrated circuit elements to be defined. The current trend for photolithography light sources is to develop a system that generates light in the extreme ultraviolet (EUV) or soft X-ray wavelengths (13–14 nm).

Various devices are the known in the art to generate EUV radiation. One of the most popular EUV radiation sources is a laser-plasma, gas condensation source that uses a gas, typically Xenon, as a laser plasma target material. Other gases, such as Argon and Krypton, and combinations of gases, are also known for the laser target material. In the known EUV radiation sources based on laser produced plasmas (LPP), the gas is typically cryogenically cooled in a nozzle to a liquid state, and then forced through an orifice or other nozzle opening into a vacuum process chamber as a continuous liquid stream or filament. Cryogenically cooled target materials, which are gases at room temperature, are required because they do not condense on the EUV optics, and because they produce minimal by-products that have to be evacuated by the process chamber. In some designs, the nozzle is agitated so that the target material is emitted from the nozzle as a stream of liquid droplets having a certain diameter (30–100 $\mu$m) and a predetermined droplet spacing.

The target stream is illuminated by a high-power laser beam, typically from an Nd:YAG laser, that heats the target material to produce a high temperature plasma which emits the EUV radiation. The laser beam is delivered to a target area as laser pulses having a desirable frequency. The laser beam must have a certain intensity at the target area in order to provide enough heat to generate the plasma.

FIG. 1 is a plan view of an EUV radiation source 10 of the type discussed above including a nozzle 12 having a target material storage chamber 14 that stores a suitable target material, such as Xenon, under pressure. A heat exchanger or condenser is provided in the chamber that cryogenically cools the target material to a liquid state. The liquid target material is forced through a narrowed throat portion or capillary tube 16 of the nozzle 12 to be emitted as a filament or stream 18 into a vacuum process chamber 26 towards a target area 20. The liquid target material will quickly freeze in the vacuum environment to form a solid filament of the target material as it propagates towards the target area 20. The vacuum environment in combination with the vapor pressure of the target material will cause the frozen target material to eventually break up into frozen target fragments, depending on the distance that the stream 18 travels and other factors.

A laser beam 22 from a laser source 24 is directed towards the target area 20 in the process chamber 26 to vaporize the target material filament. The heat from the laser beam 22 causes the target material to generate a plasma 30 that radiates EUV radiation 32. The EUV radiation 32 is collected by collector optics 34 and is directed to the circuit (not shown) being patterned, or other system using the EUV radiation. The collector optics 34 can have any shape suitable for the purposes of collecting and directing the radiation 32, such as a parabolic shape. In this design, the laser beam 22 propagates through an opening 36 in the collector optics 34, as shown. Other designs can employ other configurations.

In an alternate design, the throat portion 16 can be vibrated by a suitable device, such as a piezoelectric vibrator, to cause the liquid target material being emitted therefrom to form a stream of droplets. The frequency of the agitation determines the size and spacing of the droplets. If the target stream 18 is a series of droplets, the laser beam 22 is pulsed to impinge every droplet, or every certain number of droplets.

It is desirable that an EUV source has a good conversion efficiency. Conversion efficiency is a measure of the laser beam energy that is converted into recoverable EUV radiation. In order to achieve a good conversion efficiency, the target stream vapor pressure must be minimized because gaseous target material tends to absorb the generated EUV radiation. Further, liquid cryogen delivery systems operating near the gas-liquid phase saturation line of the target fluid's phase diagram are typically unable to project a stream of target material significant distances before instabilities in the stream cause it to break up or cause droplets to be formed. Moreover, the distance between the nozzle and the target area must be maximized to keep nozzle heating and condensable source debris to a minimum.

The process chamber is maintained at a pressure of a few militorr, or less, to minimize EUV absorption losses to vapor of the target material. As discussed above, the low temperature of the liquid target material and the low vapor pressure within the process chamber cause the target material to quickly freeze, usually as it exits the nozzle exit orifice. This quick freezing tends to create an ice build-up on the outer surface of the exit orifice of the nozzle. The ice build-up interacts with the stream, causing stream instabilities, which affects the ability of the target filament to reach the target area intact and with high positional precision. Also, filament spatial instabilities may occur as a result of freezing of the target material before radial variations in fluid velocity within the filament have relaxed, thereby causing stress-induced cracking of the frozen target filament. In other words, when the liquid target material is emitted as a liquid stream from the exit orifice, the speed of the fluid at the center of the stream is greater than the speed of the fluid at the outside of the stream. These speed variations will tend to equalize as the stream propagates. However, because the stream immediately freezes in the vacuum environment, stresses are induced within the frozen filament as a result of the velocity gradient. A further potential mechanism for spatial instabilities is cavitation of the fluid within the nozzle arising from a low pressure (less than the saturation vapor pressure) near the nozzle exit.

SUMMARY OF THE INVENTION

In accordance with the teachings of the present invention, an EUV radiation source is disclosed that employs an evaporation chamber to create a stable solid target filament. The source includes a condenser chamber for cryogenically cooling a gaseous target material into a liquid state. The liquid target material is forced through an exit orifice of a target filament generator into the evaporation chamber as a liquid target stream. The evaporation chamber has a higher pressure than a vacuum process chamber of the source to delay the time that the liquid target material freezes into a frozen target filament. The target filament, either partially or fully frozen, is emitted out of the evaporation chamber into the process chamber as a stable target filament towards a target area to be vaporized by a laser beam to generate EUV radiation.

The evaporation chamber can have various configurations. The evaporation chamber can be a relatively small chamber having a relatively high pressure as a result of the evaporating target material. Alternately, the evaporation chamber can be pressurized from the evaporating target material in combination with a supplemental gas. Further, the evaporation chamber can be a relatively large chamber having a small outlet orifice to the process chamber, where the higher pressure in the evaporation chamber is a result of evaporating target material and/or supplemental pressurization gas.

Additional objects, advantages and features of the present invention will become apparent from the following description and appended claims, taken in conjunction with the accompanying drawings.

DETAILED DESCRIPTION OF THE EMBODIMENTS

The following discussion of the embodiments of the invention directed to an EUV radiation source that employs an evaporation chamber to provide a stable solid target filament is merely exemplary in nature, and is in no way intended to limit the invention or its applications or uses.

As discussed above, an EUV radiation source typically includes a process chamber that provides a vacuum environment where the target material is vaporized to generate the EUV radiation. However, as discussed above, the vacuum environment of the process chamber creates instabilities in the target stream causing the stream to break up before it reaches the target area. The present invention addresses this concern by providing a localized high pressure proximate the target nozzle exit to provide the proper environment for stable target filament production, but still allow the process chamber to operate at a low pressure suitable for EUV generation.

Figure 1:
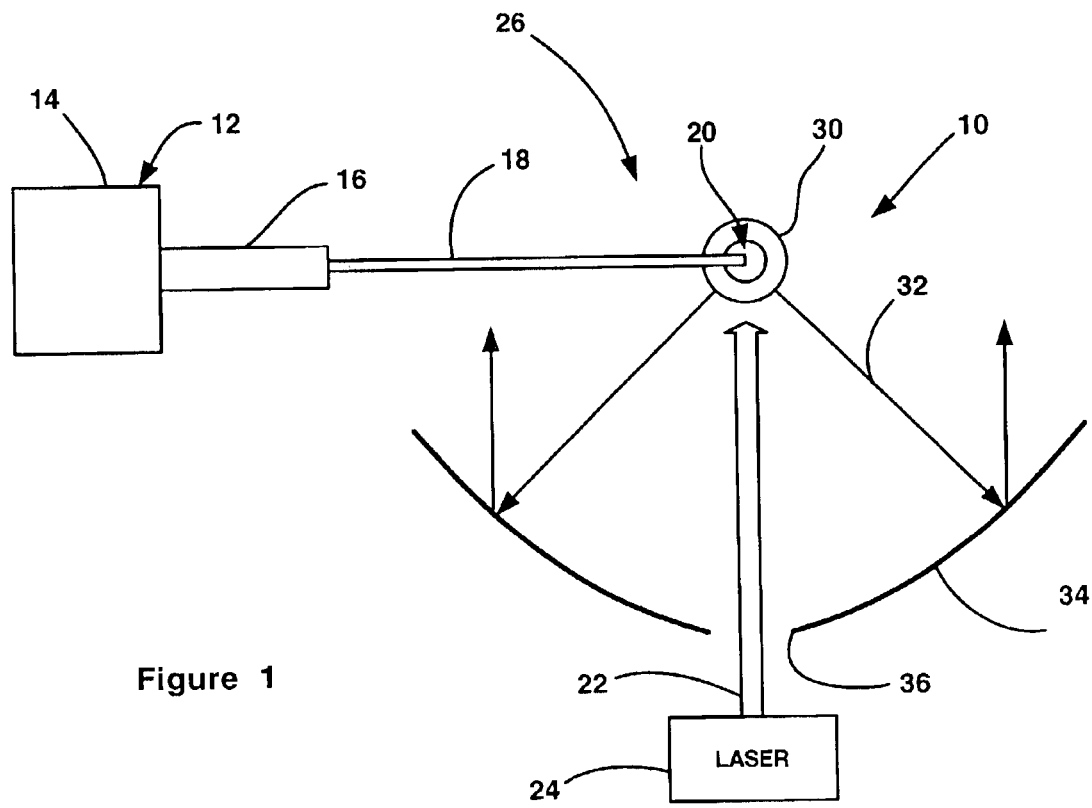
FIG. 1 is a plan view of a laser-plasma EUV radiation source.
Figure 2:
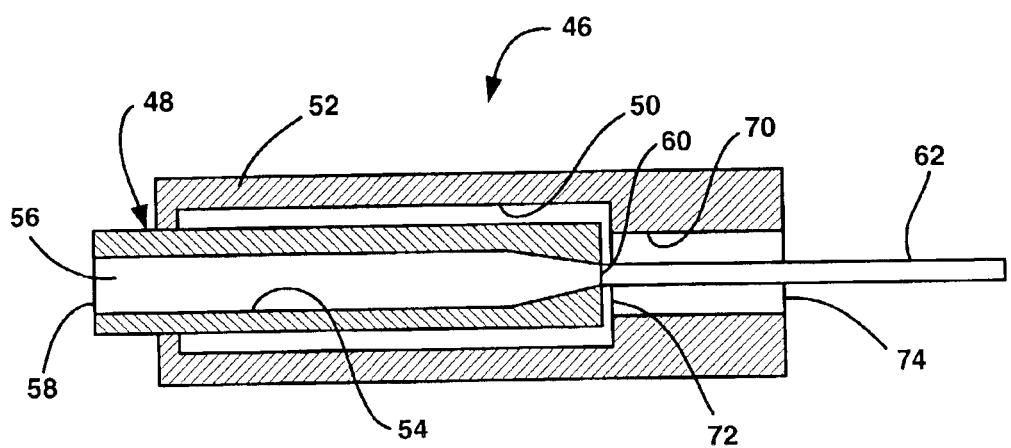
FIG. 2 is a cross-sectional view of a nozzle assembly for the radiation source shown in FIG. 1, where the nozzle assembly includes an evaporation chamber for providing a stable solid target filament, according to an embodiment of the present invention.

FIG. 2 is a cross-sectional view of a nozzle assembly 46 that can be used in the nozzle 12 of the source 10. The assembly 46 includes a target filament generator 48 mounted within an inner cylindrical chamber 50 of an outer housing 52. In one embodiment, the target filament generator is a drawn glass capillary tube and the housing is stainless steel. However, this is by way of a non-limiting example, in that other types of filament generators can be used and other materials can be employed for these parts within the scope of the present invention.

The generator 48 includes an inner cylindrical chamber 54 that accepts a pressurized cryogenically cooled liquid target material 56, such as Xenon, through an opening at one end 58 of the chamber 54. The liquid target material 56 is forced through an exit orifice 60 at an opposite end of the chamber 54 as a filament 62 of the target material. In one embodiment, the exit orifice 60 is round and has a diameter of 30–100 $\mu$m. However, this is by way of a non-limiting example in that other sizes and shaped orifices can be employed within the scope of the present invention. The target filament 62 is directed to the target area 20 to be vaporized by the laser beam 22 to generate the EUV radiation 32. Even though the filament 62 is shown as a cylindrical filament of about 30–100 $\mu$m in diameter, it is intended to represent any filament of suitable size and shape for an EUV radiation source, including an array of filaments spaced apart from each other.

According to the invention, the nozzle assembly 46 includes an evaporation chamber 70 formed in the housing 52. The chamber 70 is in fluid communication with the inner chamber 50 through an opening 72 and is in fluid communication with the process chamber 26 through an exit opening 74. The filament 62 is emitted directly into the evaporation chamber 70 from the orifice 60. The evaporation chamber 70 provides a small enclosed area that can be kept at a higher pressure than the process chamber 26, and provide a differential pressure relative thereto. The evaporation chamber 70 prevents the liquid target stream from immediately freezing as it exits the orifice 60 of the generator 48. Thus, when the target stream does freeze, it will be in an open space, and will not cause an ice build up around the outside of the orifice 60. Depending on the pressure and size of the evaporation chamber 70, the filament 62 may freeze in the chamber 70 or may partially freeze in the evaporation chamber 70 and then completely freeze in the process chamber 26.

In this embodiment, the chamber 70 is a continuous cylinder that has a diameter of about 250–400 $\mu$m and a length of about 4–6 mm. However, this is by way of a non-limiting example in that the various parameters of the chamber 70, including the shape of the chamber 70 and the size of the openings 72 and 74, can be any dimension suitable for the purposes herein. Also, the chamber 70 may have an internal diameter of a size and position suitable to provide alignment of the filament 62 to the target area 20.

In this embodiment, the pressure in the evaporation chamber 70 is provided by the evaporation of the cryogenically cooled liquid target material 56. Particularly, by properly sizing the evaporation chamber 70, the evaporated target material generated by the evaporative cooling of the filament 62 provides the gas required to develop locally high pressures within the evaporation chamber 70, and thus stabilize the target stream. Even though the evaporation chamber 70 is at a higher pressure than the process chamber 26, it is still at a much lower pressure than the saturation pressure of the feed target material, and thus the liquid target material evaporates and quickly freezes. Thus, the filament 62 is frozen to be a stable solid filament usually before it reaches the opening 74.

Because the volume of the evaporation chamber 70 is much smaller that the volume of the process chamber 26, the higher pressure of the evaporation chamber 70 has little effect on increasing the pressure of the process chamber 26 because the pumps can easily evacuate the volume of the evaporation chamber 70. Thus, it provides a high pressure relative to the few militorr of the process chamber 26. The pressure in the evaporation chamber 70 is optimized based on the saturation pressure of the target material relative to its temperature. In one embodiment, the optimum pressure in the chamber 70 is between 70 and 100 torr.

Figure 3:
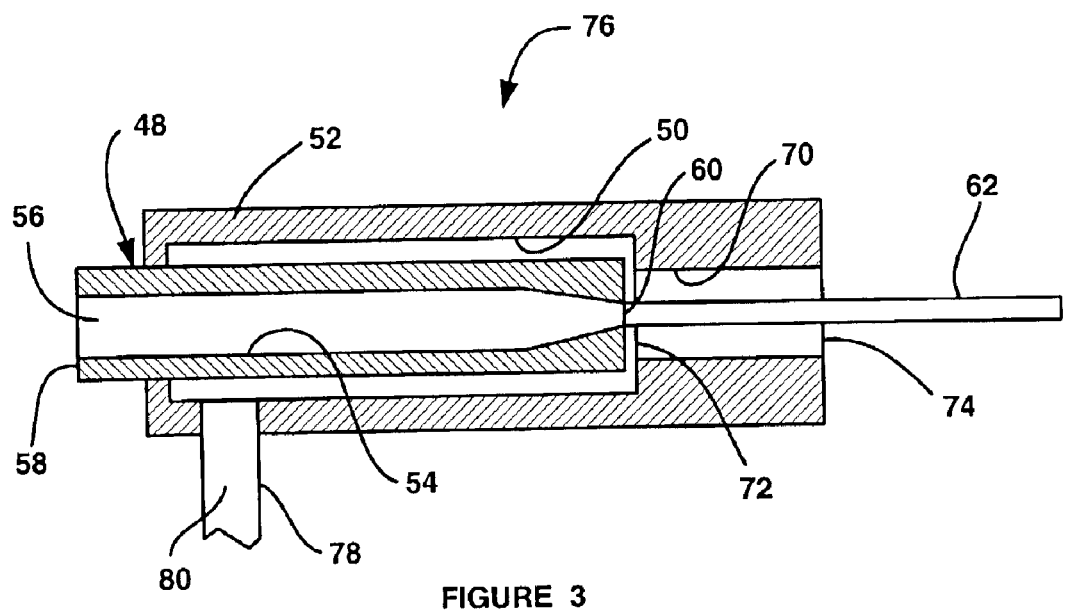
FIG. 3 is a cross-sectional view of a nozzle assembly for the radiation source shown in FIG. 1, where the nozzle assembly includes an evaporation chamber having a device for adding a supplemental pressurization gas for providing a stable solid target filament, according to another embodiment of the present invention.

FIG. 3 is a cross-sectional view of a nozzle assembly 76 that is similar to the nozzle assembly 46 above, where like reference numerals represent like components. In this embodiment, a tube 78 is in fluid communication with the chamber 52. An inactive supplemental gas 80 is introduced into the chamber 52 from a suitable source (not shown). The gas 80 propagates through the chamber 52 and into the evaporation chamber 70 through the opening 72. The supplemental gas 80 increases the pressure in the evaporation chamber 70 to further enhance the stabilization of the filament 62 as it forms into a frozen filament. The supplemental gas 80 provides more stabilization control because it provides increased pressure in the evaporation chamber 70. Thus, the exit opening 74 of the evaporation chamber 70 can be made larger than otherwise would be needed if the evaporated target material was solely relied on to provide the pressure.

In an alternate embodiment, the tube 78 can be configured to be directly in communication with the evaporation chamber 70. The supplemental gas 80 can be any gas suitable for the purposes described herein. In one embodiment, the gas 80 is the same as the target material gas, such as Xenon, Argon, Krypton, Nitrogen, etc. Also, in an alternate embodiment, evaporated gas and other matter can be removed from the evaporation chamber 70 by pumping the evaporation chamber 70 through the tube 78. This decreases the pressure in the evaporation chamber 70, reducing the time it takes the filament 62 to freeze to provide greater control of the filament freezing.

Figure 4:
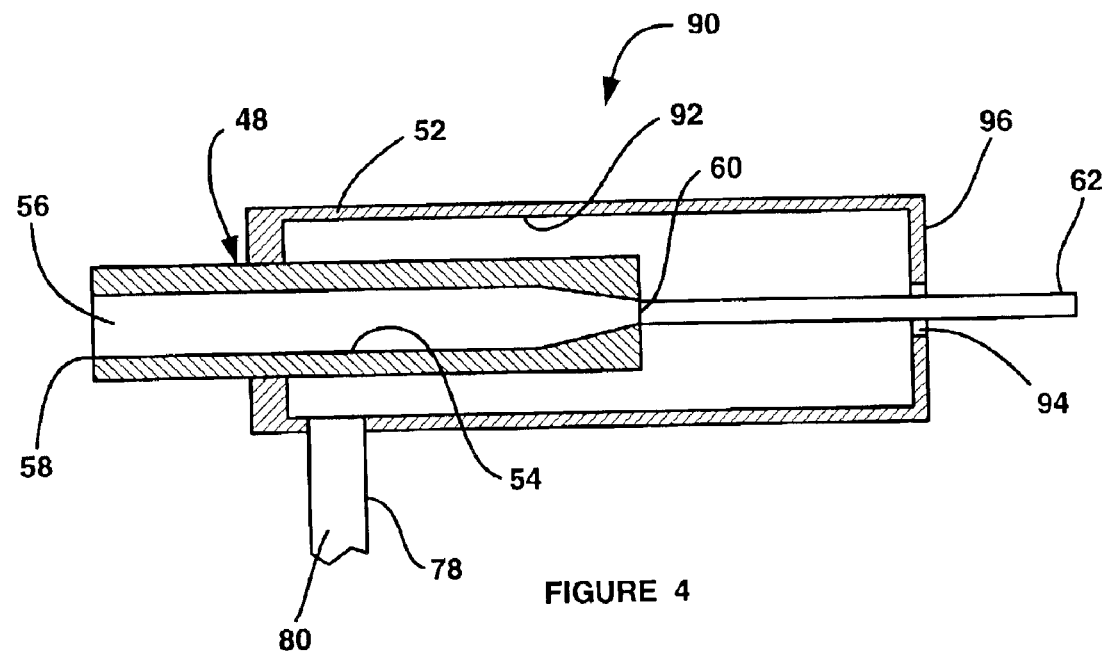
FIG. 4 is a cross-sectional view of a nozzle assembly for the radiation source shown in FIG. 1, where the nozzle assembly includes a relatively large evaporation chamber having an outlet orifice for providing a stable solid target filament, according to another embodiment of the invention.

FIG. 4 is a cross-sectional view of a nozzle assembly 90 that is similar to the nozzle assemblies 46 and 76 above, where like reference numerals represent like components. In this embodiment, the inner chamber 50 has been eliminated and the evaporation chamber 70 has been replaced with a larger evaporation chamber 92 having a small exit orifice 94 through which the filament 62 enters the process chamber 26. The filament generator 48 is positioned within the evaporation chamber 92, as shown. The evaporation chamber 92 is isolated from the process chamber 26 by the orifice 94, which is small enough so that the higher pressure in the chamber 92 does not significantly increase the pressure in the process chamber 26. In one embodiment, the diameter of the orifice 94 is greater than 500 $\mu$m and may be about 1 mm. However, this is by way of a non-limiting example in that the diameter of the orifice 94 can be any diameter suitable for the purposes described herein. As above, the higher pressure in the evaporation chamber 92 can be provided by the vaporization of the liquid target material alone or in combination with the supplemental gas 80.

Because the evaporation chamber 92 has a relatively large front 96 towards the target area, various problems, such as nozzle erosion, may occur as a result of heating of the front 96 of the chamber 92 from the plasma 30. Also, the large front 96 of the chamber 92 may cause contamination problems due to exposure to the plasma 30. Further, alignment of the filament 62 to the orifice 94 may be problematic. The smaller evaporation chamber 70 has a small front area, and thus reduced thermal and contamination concerns.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. An extreme (EUV) radiation source for generating EUV radiation, said source comprising:
    a process chamber, said process chamber operating at a low pressure;
    an outer housing;
    a target generating device at least partially mounted within the housing, said target generating device emitting a stream of target material; and
    an evaporation chamber, said evaporation chamber receiving the stream of target material from the target generating device, said stream of target material at least partially freezing in the evaporation chamber to become a frozen stream of target material as a result of evaporative cooling, said evaporation chamber operating at a higher pressure than the process chamber, wherein the stream of target material is emitted into the process chamber through an exit orifice in the evaporation chamber.

2. The source according to claim 1 wherein the evaporation chamber has a higher pressure than the process chamber as a result of evaporated target material from the stream of target material.

3. The source according to claim 1 further comprising a source of a supplemental gas in communication with the evaporation chamber, wherein the supplemental gas from the source of gas causes the evaporation chamber to be at a higher pressure than the process chamber.

4. The source according to claim 1 wherein the target generating device is a capillary tube.

5. The source according to claim 1 wherein the evaporation chamber is a continuous diameter cylinder.

6. The source according to claim 5 wherein the evaporation chamber has a diameter in the range of about 250–400 $\mu$m and a length in the range of about 4–6 mm.

7. The source according to claim 1 wherein the target generating device is mounted within the evaporation chamber within the housing.

8. The source according to claim 1 wherein the exit orifice of the evaporation chamber has a diameter greater than 500 $\mu$m.

9. The source according to claim 1 wherein the stream of target material is emitted through an exit orifice of the target generating device having a diameter between 30–100 $\mu$m.

10. The source according to claim 1 further comprising a laser, said laser directing a laser beam to a target area in the process chamber to vaporize the stream of target material and create a plasma that emits the EUV radiation.

11. The source according to claim 1 wherein the target generating device receives the target material as a liquid target material of a cryogenically cooled target gas.

12. The source according to claim 1 wherein the target material is Xenon.

13. The method according to claim 1 wherein the evaporation chamber is a continuous diameter cylinder.

14. The method according to claim 13 wherein the evaporation chamber has a diameter in the range of about 250–400 μm and a length in the range of about 4–6 mm.

15. An extreme ultraviolet (EUV) radiation source for generating EUV radiation, said source comprising:

a process chamber, said process chamber operating at a vacuum pressure;

a nozzle assembly, said nozzle assembly positioned at least partially within the process chamber, said nozzle assembly including an outer housing, a target generating device mounted within the housing, and an evaporation chamber positioned within the housing, said target generating device receiving a cryogenically cooled liquid target material and emitting a stream of the liquid target material into the evaporation chamber, said stream of target material becoming a frozen stream of target material as a result of evaporative cooling, said evaporation chamber operating at a higher pressure than the process chamber, wherein the stream of target material is emitted into the process chamber through an exit orifice in the evaporation chamber towards a target area; and a laser, said laser directing a laser beam to the target area in the process chamber to vaporize the stream of target material and create a plasma that emits the EUV radiation.

16. The source according to claim 15 wherein the evaporation chamber has a higher pressure than the process chamber as a result of evaporated target material from the stream of target material.

17. The source according to claim 15 further comprising a source of a supplemental gas in communication with the evaporation chamber, wherein the supplemental gas from the source of gas causes the evaporation chamber to be at a higher pressure than the process chamber.

18. The source according to claim 15 wherein the target generating device is a capillary tube.

19. The source according to claim 15 wherein the evaporation chamber is a continuous diameter cylinder.

20. The source according to claim 19 wherein the evaporation chamber has a diameter in the range of about 250–400 μm and a length in the range of about 4–6 mm.

21. The source according to claim 15 wherein the target generating device is mounted within the evaporation chamber within the housing.

22. The source according to claim 15 wherein the exit orifice of the evaporation chamber has a diameter greater than 500 μm.

23. The source according to claim 15 wherein the stream of target material is emitted through an exit orifice of the target generating device having a diameter between 30–100 μm.

24. A method of generating a stable stream of a target material emitted from a nozzle of an extreme ultraviolet (EUV) radiation source, comprising:

forcing a liquid target material through a target generating device into an evaporation chamber, said evaporation chamber being at a pressure that causes the stream of target material to freeze and become a stable frozen stream of the target material;

directing the stream of target material from the evaporation chamber to a target area in a process chamber, said process chamber operating at a lower pressure than the evaporation chamber; and directing a laser beam to the target area in the process chamber to vaporize the stream of target material and create a plasma that emits the EUV radiation.

25. The method according to claim 24 further comprising emitting a gas into the evaporation chamber to provide a higher pressure in the evaporation chamber than the process chamber.

26. The method according to claim 24 wherein the target generating device is mounted within the evaporation chamber within the housing.

* * * * *